(12) United States Patent
Nishimura et al.

(10) Patent No.: US 6,784,763 B2
(45) Date of Patent: Aug. 31, 2004

(54) LONGITUDINALLY COUPLED MULTI-MODE PIEZOELECTRIC BULK WAVE FILTER AND ELECTRONIC COMPONENTS USING THE SAME

(75) Inventors: Toshio Nishimura, Shiga-ken (JP); Jiro Inoue, Omihachiman (JP); Hiroaki Kaida, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/434,230

(22) Filed: May 9, 2003

(65) Prior Publication Data

US 2003/0218519 A1 Nov. 27, 2003

(30) Foreign Application Priority Data

May 24, 2002 (JP) .......................................... 2002-150817

(51) Int. Cl.[7] .............................. H03H 9/00; H03H 9/58
(52) U.S. Cl. ........................ 333/189; 333/191; 333/186; 310/361
(58) Field of Search ................................. 333/191, 189, 333/186, 187, 190, 192; 310/326, 361, 365, 366

(56) References Cited

U.S. PATENT DOCUMENTS 5,608,362 A * 3/1997 Nishimura et al. ......... 333/191
5,757,106 A * 5/1998 Sato et al. .................. 310/359
6,201,337 B1 * 3/2001 Kaida et al. ................ 310/321
6,608,428 B2 * 8/2003 Nishimura et al. ......... 310/366

FOREIGN PATENT DOCUMENTS

| JP | 05-327401 | 12/1993 |
| JP | 10-215140 | 8/1998 |

* cited by examiner

*Primary Examiner*—Dinh T. Le
(74) *Attorney, Agent, or Firm*—Keating & Bennett, LLP

(57) ABSTRACT

In a longitudinally coupled multi-mode piezoelectric bulk wave filter, a laminated piezoelectric body obtained by overlapping a plurality of excitation electrodes with piezoelectric layers therebetween and piezoelectric portions aligned with the laminated piezoelectric body are integrated. The thickness of each of the piezoelectric portions is greater than the thickness of the laminated piezoelectric body. The input electrode, the output electrode, and the ground electrode are connected to the respective excitation electrodes of the piezoelectric body. When an input signal is applied between the input electrode and the ground electrode, harmonics, with a plurality of different orders of vibrations, using the piezoelectric longitudinal effect are efficiently generated and are combined to produce the filter characteristic.

21 Claims, 16 Drawing Sheets

LONGITUDINALLY COUPLED MULTI-MODE PIEZOELECTRIC BULK WAVE FILTER AND ELECTRONIC COMPONENTS USING THE SAME

BACKGROUND OF THE INVENTION

1. Field of the Invention

The present invention relates to piezoelectric bulk wave filters for use as, for example, a band-pass filter. More particularly, the present invention relates to a longitudinally coupled multi-mode piezoelectric bulk wave filter using the piezoelectric longitudinal effect and using coupling between modes having different orders, and relates to an electronic component including such a piezoelectric bulk wave filter.

2. Description of the Related Art

Various piezoelectric bulk wave filters have been used as a band-pass filter. For frequency ranges of several megahertz to several tens of megahertz bands, double-mode piezoelectric bulk wave filters are primarily used because they are easily miniaturized and inexpensive.

This type of double-mode piezoelectric bulk wave filter is disclosed in, for example, Japanese Unexamined Patent Application Publication No. 5-327401.

FIG. 15 shows the cross sectional view of a known double-mode piezoelectric bulk wave filter using the thickness longitudinal vibration mode.

A piezoelectric bulk wave filter 201 includes a piezoelectric plate 202 undergoing a polarizing process in the thickness direction. On the top surface of the piezoelectric plate 202, a pair of excitation electrodes 203 and 204 is provided. On the bottom surface, a common excitation electrode (ground electrode) 205 is disposed so as to face the excitation electrodes 203 and 204 with the excitation plate 202 sandwiched therebetween.

To operate the piezoelectric bulk wave filter 201, an input signal is applied between the excitation electrodes 203 and 205 on the top surface. This causes the piezoelectric plate 202 to produce the symmetric mode shown in FIG. 16A and the anti-symmetric mode shown in FIG. 16B. These modes are combined to define a filter passband. The output is obtained from between the excitation electrode 204 and the ground electrode 205.

In place of the thickness longitudinal vibration mode, there is also known a double-mode piezoelectric bulk wave filter using the thickness shear mode obtained by applying the polarizing process to the piezoelectric plate 202 in the direction parallel to the top surface of the piezoelectric plate 202.

In the known piezoelectric bulk wave filter 201, the strength of the coupling between the symmetric mode and the anti-symmetric mode depends on the distance between the excitation electrodes 203 and 204. The distance determines the frequency difference between the frequency of the symmetric mode and the frequency of the anti-symmetric mode. This determines the passband.

Therefore, in order to obtain a broadband filter, the distance between the excitation electrodes 203 and 204 must be narrowed to increase the degree of coupling between both modes and to increase the frequency difference between the frequencies of both modes.

The excitation electrodes 203 and 204 are normally generated by applying conductive paste by a screen-printing method. There is a limit to how narrow the distance between the excitation electrodes 203 and 204 can be using the screen-printing method. Photolithography enables the distance between the excitation electrodes 203 and 204 to be even more narrowed. Applying photolithography is, however, expensive.

Furthermore, even though the distance between the excitation electrodes 203 and 204 can be narrowed, the capacitance between the input and output is increased and the attenuation is decreased.

SUMMARY OF THE INVENTION

In order to overcome the problems described above, preferred embodiments of the present invention provide a longitudinally coupled multi-mode piezoelectric bulk wave filter which achieves widening of the passband, increasing out-of-band attenuation, and being manufactured inexpensively.

According to a first preferred embodiment of the present invention, a longitudinally coupled multi-mode piezoelectric bulk wave filter using the piezoelectric longitudinal effect includes at least one laminated piezoelectric body having at least four excitation electrodes disposed substantially parallel and spaced from one another at a distance D, and a plurality of piezoelectric layers, each disposed between two adjacent electrodes of the excitation electrodes, the plurality of piezoelectric layers being polarized in a direction that is substantially perpendicular or substantially parallel to the excitation electrodes, wherein the cross section of the at least one laminated piezoelectric body in the direction substantially perpendicular to the laminated direction of the at least one laminated piezoelectric body is a rectangle having a thickness T, a piezoelectric portion having a thickness that is greater than the thickness dimension T and aligned with the at least one laminated piezoelectric body, an input electrode, an output electrode, a ground electrode, the excitation electrodes including a first group of excitation electrodes electrically connected to the input electrode, a second group of excitation electrodes electrically connected to the output electrode, and a third group of excitation electrodes electrically connected to the ground electrode, the first group and the third group being alternately disposed in the laminated direction, and the second group and the third group being alternately disposed in the laminated direction. In the longitudinally coupled multi-mode piezoelectric bulk wave filter, when an input signal is applied between the input electrode and the ground electrode, mode vibrations having different orders are generated and combined into an output signal between the output electrode and the ground electrode, and the ratio of the thickness T to the distance D is equal to or less than about 0.9.

In the longitudinally coupled multi-mode piezoelectric bulk wave filter, the input electrode, the output electrode, and the ground electrode may be disposed on the piezoelectric portion. This enables the piezoelectric portion aligned with the laminated piezoelectric body to have the input electrode, the output electrode, and the ground electrode easily formed and to be easily electrically connected to the outside even though the laminated piezoelectric body is small.

The longitudinally coupled multi-mode piezoelectric bulk wave filter may further include a piezoelectric substrate for providing the at least one laminated piezoelectric element and piezoelectric portion thereon. In the longitudinally coupled multi-mode piezoelectric bulk wave filter, a plurality of grooves are disposed on one side of the piezoelectric substrate, and a portion of the piezoelectric substrate between each pair of adjacent grooves of the plurality of grooves defines the laminated piezoelectric element and a remaining piezoelectric substrate portion defines the piezoelectric element. In this case, after the piezoelectric substrate is prepared, a plurality of grooves is formed on one surface of the piezoelectric substrate. This achieves easy formation of the laminated piezoelectric body and the piezoelectric portion.

According to another preferred embodiment of the present invention, a groove is disposed on one surface of a piezoelectric substrate for providing the at least one laminated piezoelectric element and the piezoelectric portion thereon, a portion between the bottom of the groove and the other principal surface of the piezoelectric substrate defines the laminated piezoelectric element, and a piezoelectric substrate portion on both sides of the groove defines the piezoelectric portion.

According to another preferred embodiment of the present invention, a plurality of laminated piezoelectric elements are provided on the piezoelectric substrate.

According to another preferred embodiment of the present invention, the mode vibrations having different orders are harmonics waves in the longitudinal vibration mode using the piezoelectric longitudinal effect.

According to another preferred embodiment of the present invention, the mode vibrations having different orders are harmonics waves in the thickness longitudinal vibration mode using the piezoelectric longitudinal effect.

According to yet another preferred embodiment of the present invention, an electronic component includes a casing substrate, a longitudinally coupled multi-mode piezoelectric bulk wave filter according to the above-described first preferred embodiment of the present invention mounted on the casing substrate, and a cap material fixed to the casing substrate so as to cover the longitudinally coupled multi-mode piezoelectric bulk wave filter. That is, the longitudinally coupled multi-mode piezoelectric bulk wave filter according to preferred embodiments of the present invention can be provided as an electronic component using a package including a casing substrate and a cap material.

According to a third preferred embodiment of the present invention, an electronic component includes a casing substrate, a reflecting layer disposed on the casing substrate, and a longitudinally coupled multi-mode piezoelectric bulk wave filter according to the above-described first preferred embodiment of the present invention fixed to the casing substrate via the reflecting layer, wherein the acoustic impedance $Z_2$ of the reflecting layer is less than the acoustic impedance $Z_1$ of a material forming a laminated piezoelectric portion of the longitudinally coupled multi-mode piezoelectric bulk wave filter and less than the acoustic impedance $Z_3$ of the casing substrate.

Other features, elements, characteristics and advantages of the present invention will become more apparent from the following detailed description of preferred embodiments thereof with reference to the attached drawings.

DETAILED DESCRIPTION OF PREFERRED EMBODIMENTS

Preferred embodiments of the present invention will be described with reference to drawings.

Figure 2A:
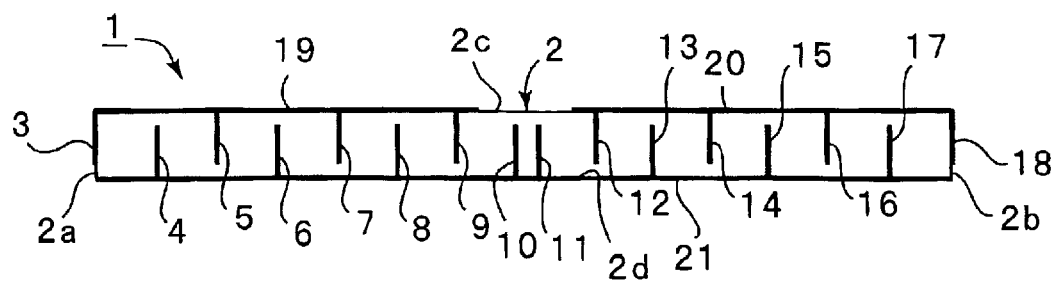
FIG. 2A is an illustration showing the construction of a longitudinally coupled multi-mode piezoelectric bulk wave filter according to preferred embodiments of the present invention and FIGS. 2B to 2D are illustrations showing the 14th harmonic, 13th harmonic, and the 15th harmonic, respectively, which are generated by this longitudinally coupled multi-mode piezoelectric bulk wave filter.

FIG. 2A shows a general construction of a longitudinally coupled multi-mode piezoelectric bulk wave filter 1 that is not known. The longitudinally coupled multi-mode piezoelectric bulk wave filter 1 includes a piezoelectric body 2 that is a substantially square bar having a substantially rectangular cross section. A plurality of excitation electrodes 3 to 18 is disposed along the length direction of the piezoelectric body 2. The excitation electrode 3 is disposed on an end surface 2a of the piezoelectric body 2 while the excitation electrode 18 is disposed on the other end surface 2b of the piezoelectric body 2. The remaining excitation electrodes 4 to 17 are arranged to define internal electrodes.

The excitation electrodes 3, 5, 7, 9, 12, 14, 16, and 18 extend from a top surface 2c of the piezoelectric body 2 toward, but not touching, a bottom surface 2d. The excitation electrodes 4, 6, 8, 10, 11, 13, 15, and 17 extend from the bottom surface 2d toward, but not touching, the top surface 2c.

An input electrode 19 is disposed on the top surface 2c. The input electrode 19 is electrically connected to a first group of excitation electrodes that involves the excitation electrodes 3, 5, 7, and 9. An output electrode 20 is disposed on the top surface 2c. The output electrode 20 is electrically connected to a second group of excitation electrodes that involves the excitation electrodes 12, 14, 16, and 18. A ground electrode 21 is disposed on the bottom 2d. The ground electrode 21 is electrically connected to a third group of excitation electrodes that involves the excitation electrodes 4, 6, 8, 10, 11, 13, 15, and 17.

The excitation electrodes 3, 5, 7, and 9 and the excitation electrodes 4, 6, 8, and 10 are alternately disposed starting from the excitation electrode 10 toward the end surface 2a in the length direction of the piezoelectric body 2, or the laminated direction of the excitation electrodes. The excitation electrodes 11, 13, 15, and 17 and the excitation electrodes 12, 14, 16, and 18 are alternately disposed starting from the excitation electrode 11 toward the end surface 2b in the length direction of the piezoelectric body 2.

The piezoelectric body 2 includes PZT ceramics, such as piezoelectric ceramics and undergoes the polarizing process in the length direction thereof.

Figure 2B:
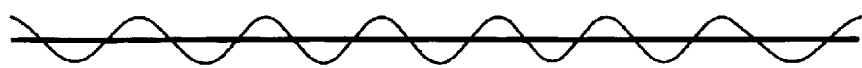
Figure 2C:
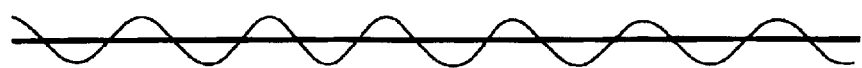
Figure 2D:

When an alternating voltage is applied across the input electrode 19 and the ground electrode 21, the piezoelectric longitudinal effect generates the length mode vibration in the piezoelectric bulk wave filter 1. In particular, the symmetric mode strongly generates the 14th harmonic in longitudinal vibration in FIG. 2B while the anti-symmetric mode strongly generates the 13th harmonic and 15th harmonic in FIGS. 2C and 2D, respectively. Accordingly, the filter characteristic of the piezoelectric bulk wave filter 1 is obtained by combining the 13th to 15th harmonics.

In the multi-mode piezoelectric bulk wave filter 1, the vibration mode to be used is not particularly restricted. Various vibration modes are used in accordance with the shape of the piezoelectric body 2. The number of excitation electrodes can be also appropriately changed in accordance with the order of the harmonic to be used.

Figure 3:
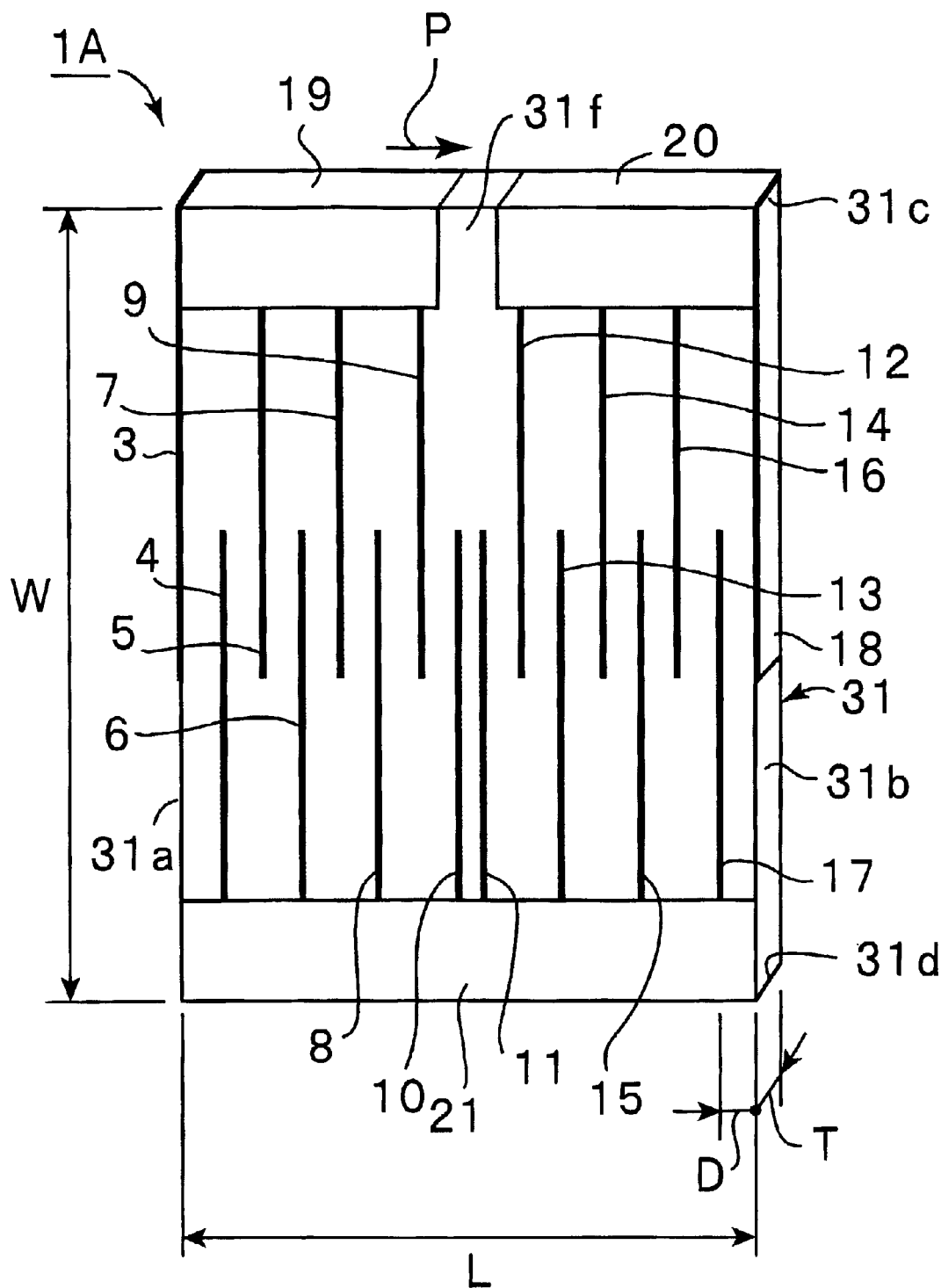
FIG. 3 is a perspective view showing another example of the longitudinally coupled multi-mode piezoelectric bulk wave filter which is not known to the public, that is a premise of preferred embodiments of the present invention.

FIG. 3 shows a perspective view of a multi-mode piezoelectric bulk wave filter 1A. The multi-mode piezoelectric bulk wave filter 1A is a specific example of the multi-mode piezoelectric bulk wave filter 1 which includes a piezoelectric body 31 having a substantially rectangular bar shape. The piezoelectric body 31 undergoes the polarizing process in the direction indicated by an arrow P in FIG. 3, that is, the direction from a side surface 31a thereof to a side surface 31b thereof.

In the piezoelectric body 31, the excitation electrodes 3 to 18 are preferably formed in the same manner as in the piezoelectric bulk wave filter 1. The excitation electrodes 3 to 18 are disposed in a central region between a top surface 31c and a bottom surface 31d of the piezoelectric body 31 so as to overlap one another through piezoelectric layers.

In the piezoelectric bulk wave filter 1A, the input electrode 19 and the output electrode 20 are arranged so as to cover respective corners of the top surface 31c and extend over respective portions of a side surface 31f of the piezoelectric body 31. Likewise, the ground electrode 21 is arranged so as to cover the bottom surface 31d and extend over a portion of the side surface 31f.

In the piezoelectric bulk wave filter 1A, when an alternating voltage is applied between the input electrode 19 and the output electrode 20, the thickness longitudinal vibration mode using the piezoelectric longitudinal effect is strongly generated.

Figure 4:
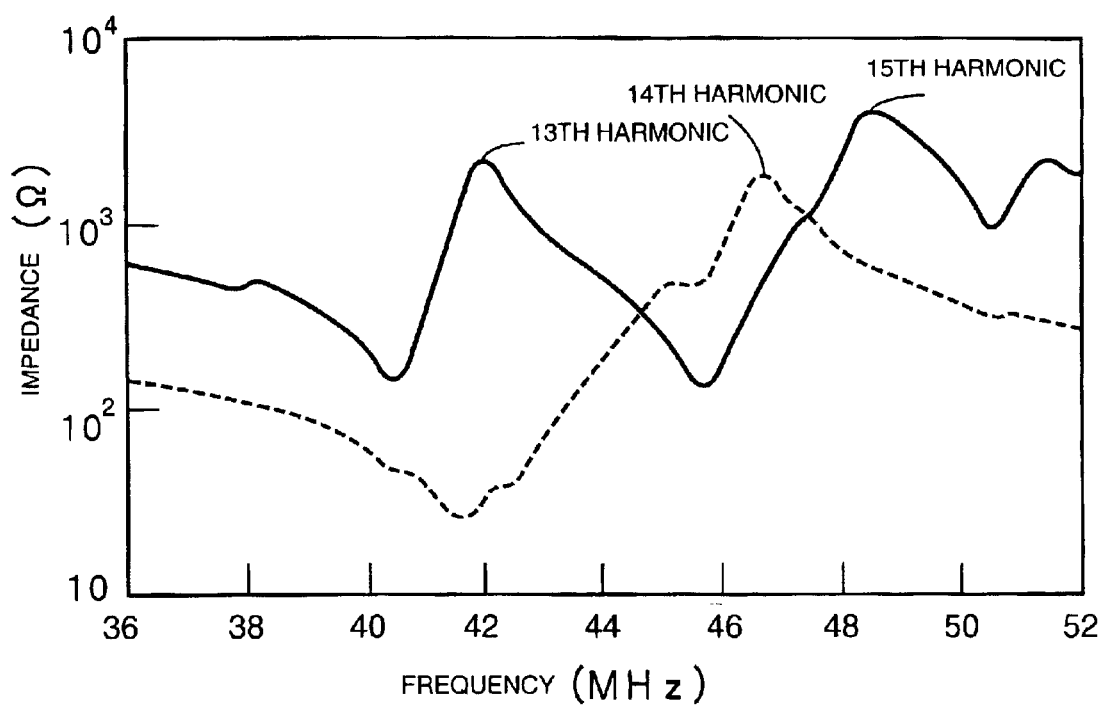
FIG. 4 is a graph illustrating the 13th to 15th harmonics generated by the longitudinally coupled multi-mode piezoelectric bulk wave filter in FIG. 3.
Figure 5:
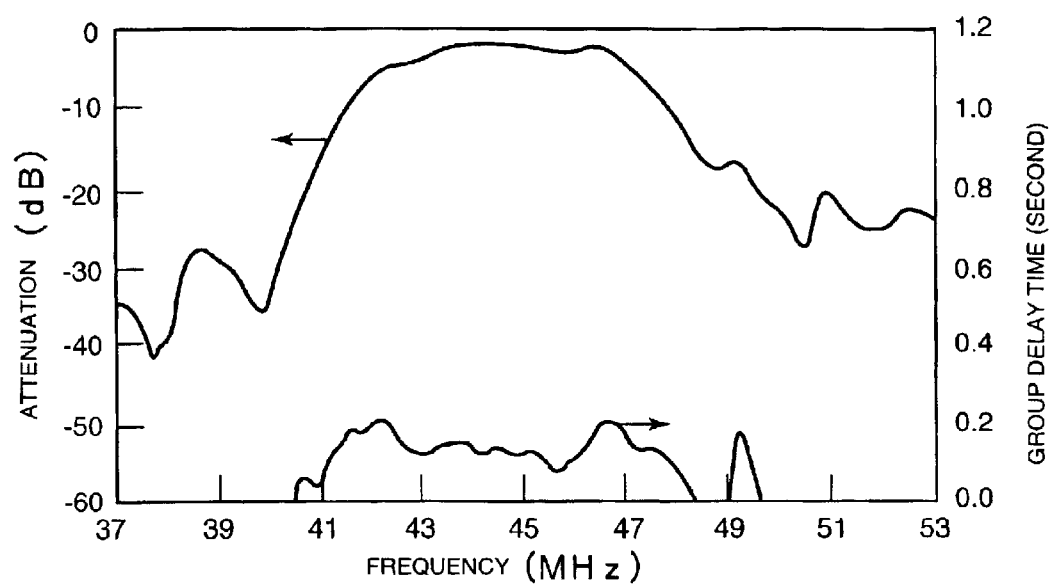
FIG. 5 is a graph showing the filter characteristic of the longitudinally coupled multi-mode piezoelectric bulk wave filter in FIG. 3.

Using PZT ceramics, the piezoelectric body 31 is constructed in which the thickness D of the piezoelectric layer between the adjacent excitation electrodes connected to different electrical potentials is about 40 $\mu$m, the thickness dimension T, which is substantially identical to the distance between the side surface 31f and a side surface 31g, is about 32 $\mu$m, the length L between the side surface 31a and the side surface 31b is about 620 $\mu$m, and the width w between the top surface 31c and the bottom surface 31d is about 890 $\mu$m. FIG. 4 shows vibration modes being generated when the piezoelectric bulk wave filter 1A constructed in the above-described manner is driven. In FIG. 4, the dashed line represents the symmetric mode in which the 14th harmonic in the thickness longitudinal vibration is efficiently generated while the solid line represents the anti-symmetric mode in which the 13th and 15th harmonics in the thickness longitudinal vibration are efficiently generated. FIG. 5 shows the filter characteristic of the multi-mode piezoelectric bulk wave filter 1A.

The figure indicates that combination of the 13th to 15th harmonics produces a wideband filter characteristic.

In a known double-mode piezoelectric bulk wave filter 201, the distance between excitation electrodes 203 and 204 disposed on one surface of a piezoelectric plate 202 depends on the frequency difference between the frequency of the symmetric mode and the frequency of the anti-symmetric mode. On the other hand, in the multi-mode piezoelectric bulk wave filter 1A, the frequency differences among the 13th harmonic to the 15th harmonic are separated as much as the ratios of the orders of higher order modes, regardless of the distance between the excitation electrodes. Hence, the multi-mode piezoelectric bulk wave filter 1A having a desired bandwidth is easily realized simply by selecting a higher order mode in accordance with the desired bandwidth.

In the multi-mode piezoelectric bulk wave filter 1A, for example, there are provided 15 piezoelectric layers between the excitation electrodes 3 and 18, in which the 13th to 15th harmonics are strongly generated. By changing the number of piezoelectric layers, three harmonics having different orders can be strongly generated. This can define a triple-mode piezoelectric bulk wave filter.

In order to obtain a broad bandwidth, the known double-mode piezoelectric bulk wave filter 201 requires an increase in the high production accuracy of the excitation electrodes 203 and 204. In the multi-mode piezoelectric bulk wave filter 1A, a desired bandwidth or a broad bandwidth can be easily realized without increasing the production accuracy significantly.

In the piezoelectric bulk wave filter 1A, the attenuation depends on the ratio of the capacitance $C_{I-G}$ between the input electrode 19 and the ground electrode 21 to the capacitance $C_{I-O}$ between the input electrode 19 and the output electrode 20. As the ratio $C_{I-G}/C_{I-O}$ increases (or $C_{I-O}$ decreases), the attenuation increases. The excitation electrodes 10 and 11 connected to the ground electrode 21 are disposed between the excitation electrodes 3, 5, 7, and 9 electrically connected to the input electrode 19 and the excitation electrodes 12, 14, 16, and 18 electrically connected to the output electrode 20. Since $C_{I-O}$ decreases, an increase in the out-of-band attenuation is achieved. Accordingly, the out-of-band attenuation can be increased compared to the known piezoelectric bulk wave filter 201.

The thickness of each of the piezoelectric layers between the excitation electrodes connected to different electrical potentials is not necessarily even. By disposing each of the piezoelectric layers having different thickness, the excitation efficiencies of the harmonics to use may be increased while the excitation efficiencies of the harmonics to be spurious may be decreased.

Figure 6:
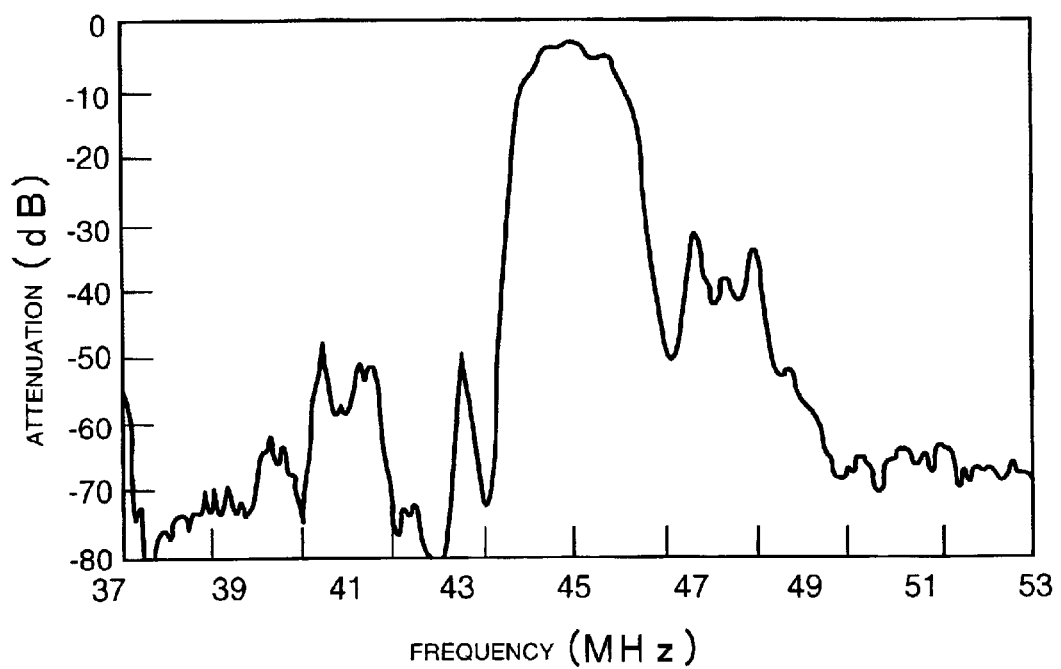
FIG. 6 is a graph showing the filter characteristic of a filter in the two-element cascade connection using the longitudinally coupled multi-mode piezoelectric bulk wave filter in FIG. 3.

FIG. 6 shows the filter characteristic of a filter unit obtained by cascading two multi-mode piezoelectric bulk wave filters 1A. As is observed from a comparison between FIGS. 5 and 6, cascading two multi-mode piezoelectric bulk wave filters 1A can efficiently improve the selectivity.

In the multi-mode piezoelectric bulk wave filter 1A in FIG. 3, the thickness dimension T of the piezoelectric body 31 is decreased up to as thin as about 32 μm in order to use the 13th to 15th harmonics in the thickness longitudinal vibration. Therefore, since the mechanical strength of the piezoelectric bulk wave filter 1A is not strong enough, careful handling is required.

The inventors of the present invention discovered that in the multimode piezoelectric bulk wave filter 1A, harmonics having different orders can be efficiently generated when there is a particular relationship between the thickness T of the piezoelectric body 31 and the thickness D of the piezoelectric layer between the adjacent excitation electrodes connected to different electrical potentials. That is, the inventors discovered that harmonics to use having different orders can be efficiently generated when the ratio T/D is equal to or below about 0.9. This will be described with reference to FIG. 7.

Figure 7:
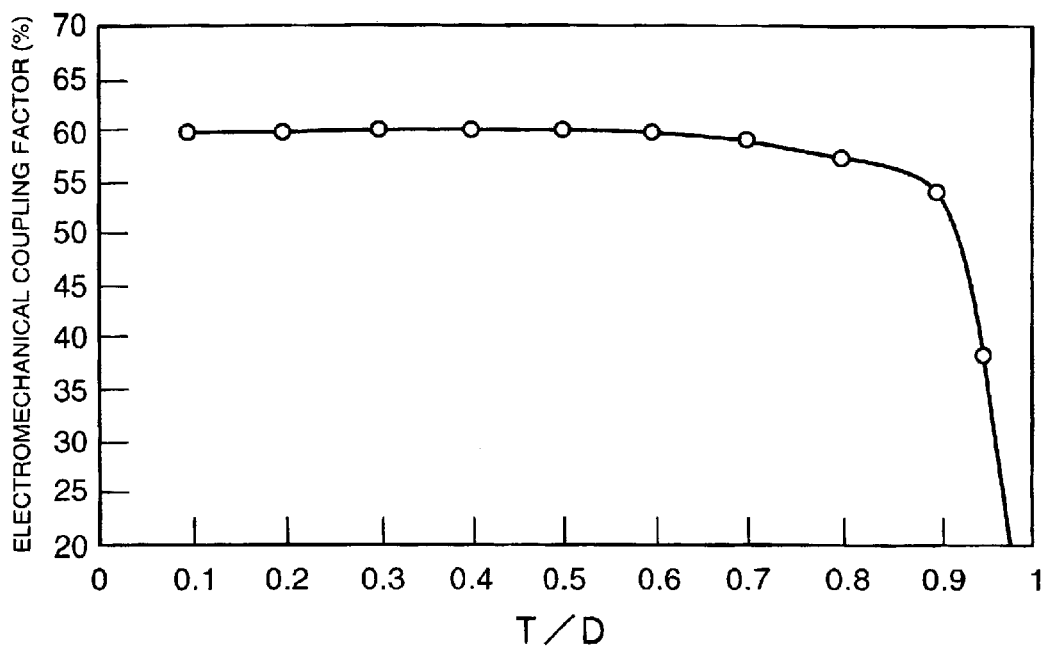
FIG. 7 is a graph showing variations in the width of the pass band of the longitudinally coupled multi-mode piezoelectric bulk wave filter in FIG. 3 in accordance with the ratio T/D.

FIG. 7 shows variations in the electromechanical coupling factor in accordance with variations in the ratio T/D of the piezoelectric bulk wave filter 1A. The figure indicates that the electromechanical coupling factor is large when the ratio T/D<=about 0.9. This allows the piezoelectric bulk wave filter 1A to have substantially a broad bandwidth. That is, the 13th to 15th harmonics can be efficiently generated.

However, when the ratio T/D is equal to or below about 0.9, the thickness T of the piezoelectric body 31 is as thin as the thickness of the piezoelectric bulk wave filter 1A. The mechanical strength of the piezoelectric bulk wave filter 1A therefore decreases.

Figure 1A:
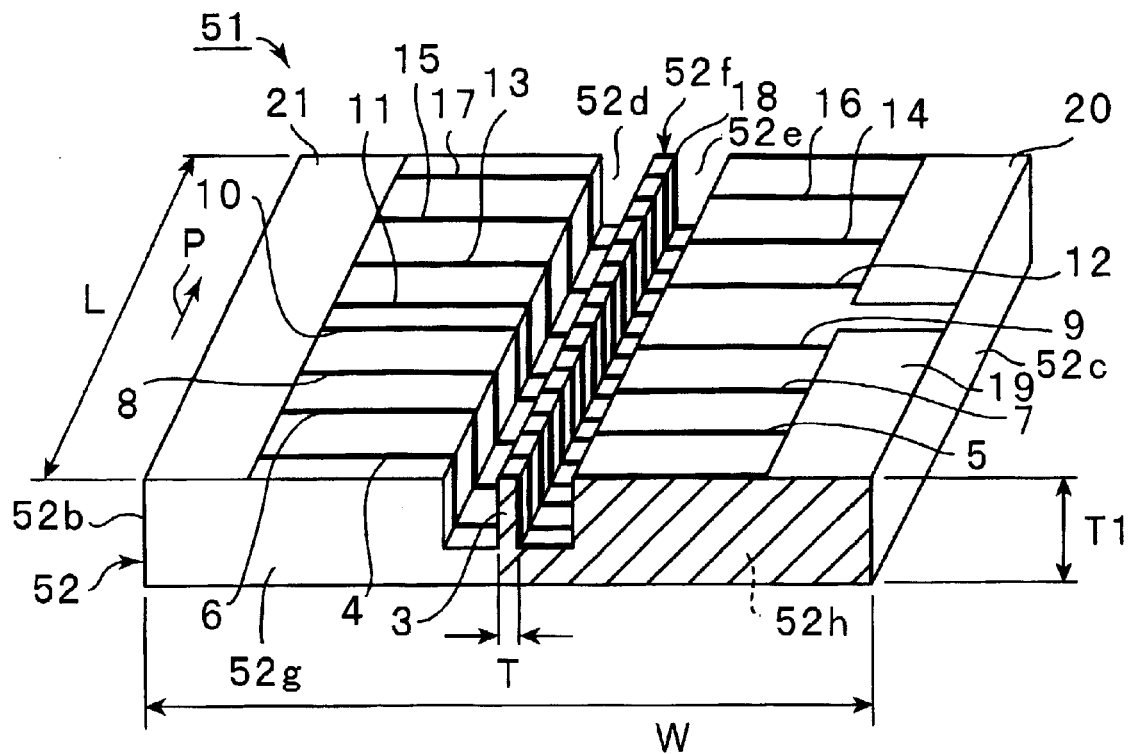
FIG. 1A is a perspective view showing the external view of a longitudinally coupled multi-mode piezoelectric bulk wave filter according to a first preferred embodiment of the present invention.
Figure 1B:
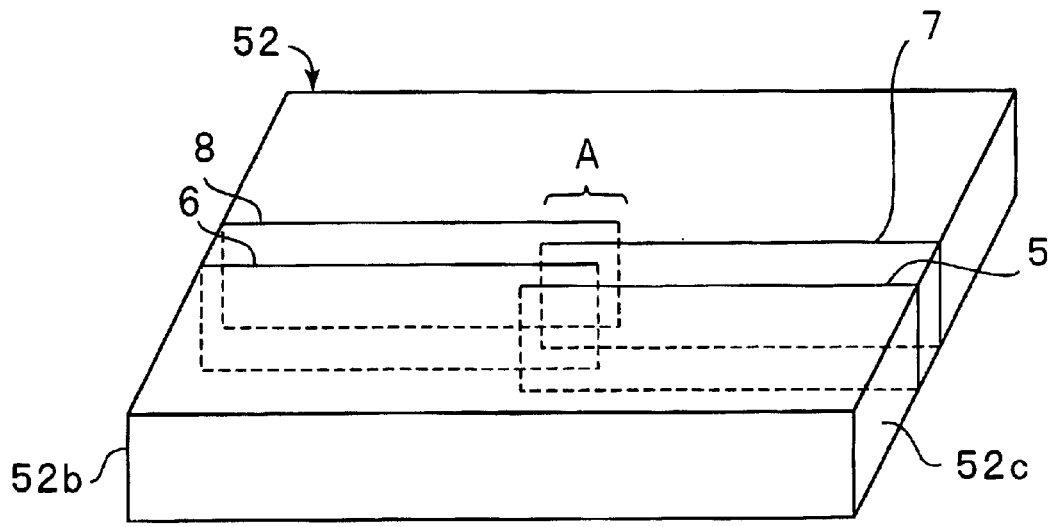
FIG. 1B is a perspective view illustrating excitation electrodes disposed in a piezoelectric substrate.

FIGS. 1A and 1B show a perspective view of a longitudinally coupled multi-mode piezoelectric bulk wave filter 51 according to a first preferred embodiment of the present invention and a perspective view showing the disposition of excitation electrodes in a piezoelectric substrate 52, respectively.

The longitudinally coupled multi-mode piezoelectric bulk wave filter 51 is preferably constructed with the piezoelectric substrate 52 that has a substantially rectangular shape and includes piezoelectric ceramics, such as PZT ceramics or other suitable materials. In FIG. 1A, in the middle of a top surface of the piezoelectric substrate 52, two grooves 52d and 52e extend substantially parallel to side surfaces 52b and 52c. Producing the grooves 52d and 52e defines a laminated piezoelectric body 52f, a projection portion, in the middle of the piezoelectric substrate 52.

The rest of the piezoelectric substrate 52 involves piezoelectric portions 52g and 52h that are aligned with the laminated piezoelectric body 52f.

The laminated piezoelectric body 52f is preferably constructed in the same manner as the longitudinally coupled multi-mode piezoelectric bulk wave filter 1A. This will be described in detail.

In order to obtain the piezoelectric bulk wave filter 51, the piezoelectric substrate 52 having a substantially rectangular shape is prepared. A plurality of excitation electrodes is formed inside the piezoelectric substrate 52 with the aid of co-firing. In FIG. 1B, the excitation electrodes 5 to 8 are disposed. Although the excitation electrodes 3 to 18 are provided in the laminated piezoelectric body 52f in the same manner as in the piezoelectric bulk wave filter 1A, FIG. 1B schematically shows the excitation electrodes 5 to 8 alone. The excitation electrodes 5 and 7 extend to a central region from the side surface 52c toward the side surface 52b, the excitation electrodes 6 and 8 extend to the central region from the side surface 52b towards the side surface 52c, and the excitation electrodes 5 to 8 are overlapped with piezoelectric layers therebetween.

That is, a plurality of excitation electrodes is overlapped with the piezoelectric layers therebetween.

When the piezoelectric bulk wave filter 51 is manufactured, the grooves 52d and 52e are formed on the top surface of the piezoelectric substrate 52 so that the laminated piezoelectric body 52f is disposed in width "A" where the plurality of excitation electrodes overlaps.

The piezoelectric substrate 52 undergoes the polarizing process in the direction of the arrow P. The laminated piezoelectric body 52f therefore undergoes the polarizing process in the length direction L.

The excitation electrodes 3, 5, 7, and 9 are electrically connected to the input electrode 19, the excitation electrodes 12, 14, 16, and 18 are electrically connected to the output electrode 20, and the excitation electrodes 4, 6, 8, 10, 11, 13, 15, and 17 are electrically connected to the ground electrode 21.

In the present preferred embodiment, the input electrode 19 and the output electrode 20 are disposed on the top surface of the piezoelectric portion 52h, and the ground electrode 21 is disposed on the top surface of the piezoelectric portion 52g.

Since being formed by disposing the grooves 52d and 52e on the piezoelectric substrate 52, the piezoelectric portions 52g and 52h each have the thickness T1 that is thicker than the thickness T of the laminated piezoelectric body 52f. The thickness T of the laminated piezoelectric body 52f indicates the distance between a pair of surfaces facing the respective grooves 52d and 52e. As described earlier, the harmonics in the thickness longitudinal vibration are efficiently generated where the ratio T/D<=about 0.9. Accordingly, the thickness T of the laminated piezoelectric body 52f should be as thin as, for example, about 32 μm.

On the other hand, the thickness T1 of the piezoelectric substrate 52 does not need to be reduced or thinned to as much as the thickness T of the laminated piezoelectric body 52f. In other words, the thickness T1 is designed to be more than the thickness T.

Furthermore, since the piezoelectric portions 52g and 52h are aligned with the laminated piezoelectric body 52f, the mechanical strength of the entirety of the piezoelectric bulk wave filter 51 is sufficiently increased.

In the multi-mode piezoelectric bulk wave filter 51, the laminated piezoelectric body 52f defines a multi-mode piezoelectric bulk wave filter portion that functions in the same manner as the multi-mode piezoelectric bulk wave filters 1 and 1A. The laminated piezoelectric body 52*f* is aligned with the piezoelectric portions 52*g* and 52*h*, and they are integrated. Therefore, the piezoelectric bulk wave filter 51 accommodating high frequencies can be offered because of an increase in the mechanical strength thereof.

Although the laminated piezoelectric body 52*f* functioning as a filter is aligned with the piezoelectric portions 52*g* and 52*h*, the filter characteristic is not substantially deteriorated. Therefore, since the mechanical strength of the piezoelectric bulk wave filter 51 is increased, the piezoelectric bulk wave filter 51 accommodating high frequencies can be offered. This will be described with reference to FIGS. 8 and 9.

Figure 8:
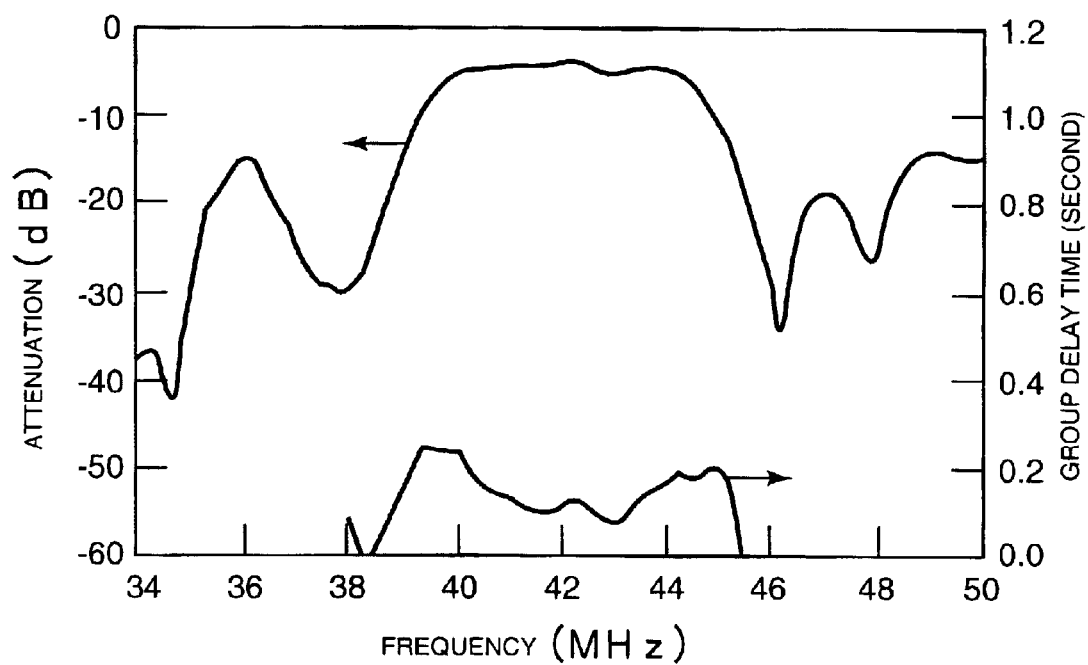
FIG. 8 is a graph showing the filter characteristic of the longitudinally coupled multi-mode piezoelectric bulk wave filter according to a first preferred embodiment of the present invention.
Figure 9:
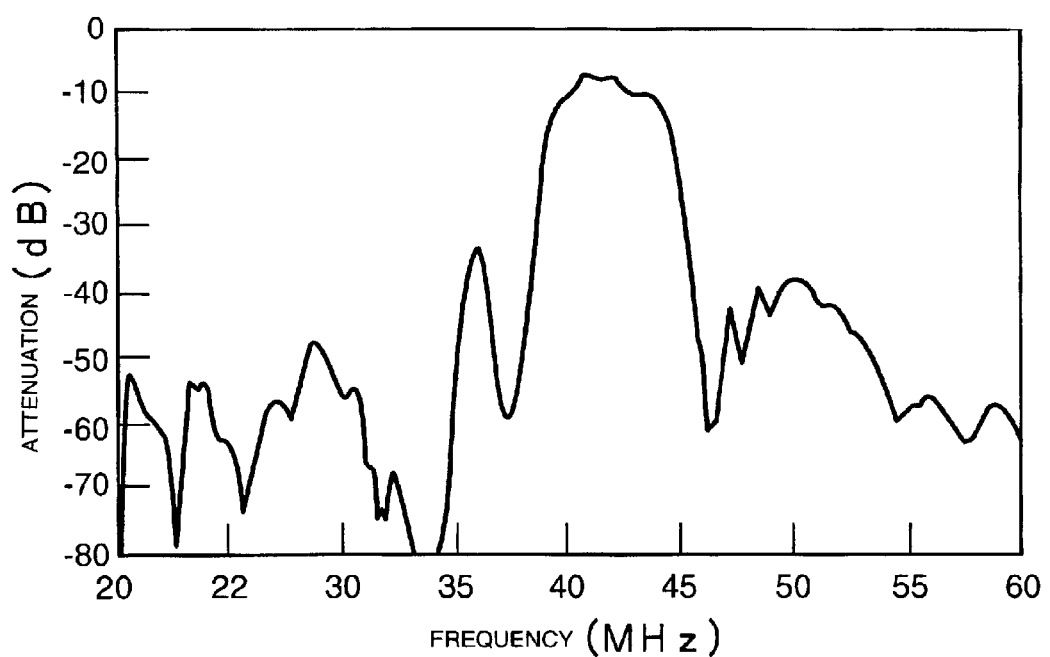
FIG. 9 is a graph showing the filter characteristic of a filter in the two-element cascade connection using the longitudinally coupled multi-mode piezoelectric bulk wave filter according to the first preferred embodiment of the present invention.

The thickness of the piezoelectric layer between the adjacent excitation electrodes in the laminated piezoelectric body 52*f* connected to different electrical potentials is about 40 $\mu$m, the length L of the laminated piezoelectric body 52*f* is about 620 $\mu$m, the width W of the piezoelectric body 52 is about 890 $\mu$m, the thickness T of the laminated piezoelectric body 52*f* is about 32 $\mu$m, and the thickness T1 of the piezoelectric substrate 52 is about 200 $\mu$m. That is, the laminated piezoelectric body 52*f* is constructed so as to have substantially the same dimensions as the piezoelectric bulk wave filter 1A. FIG. 8 shows the filter characteristic of the piezoelectric bulk wave filter 51. The figure indicates that the 13th to 15th harmonics are efficiently generated and combined, thus exhibiting broadband filter characteristics. FIG. 9 shows filter characteristic of two piezoelectric bulk wave filters 51 arranged in a cascade configuration. The figure indicates that cascading two piezoelectric bulk wave filters 51 can efficiently increase the selectivity.

In the first preferred embodiment, disposing the grooves 52*d* and 52*e* in the substantially rectangular piezoelectric substrate 52 forms the laminated piezoelectric body 52*f* that operates as the piezoelectric bulk wave filter. To dispose a partially thin laminated piezoelectric portion on the piezoelectric substrate, another method may be applied.

Figure 10:
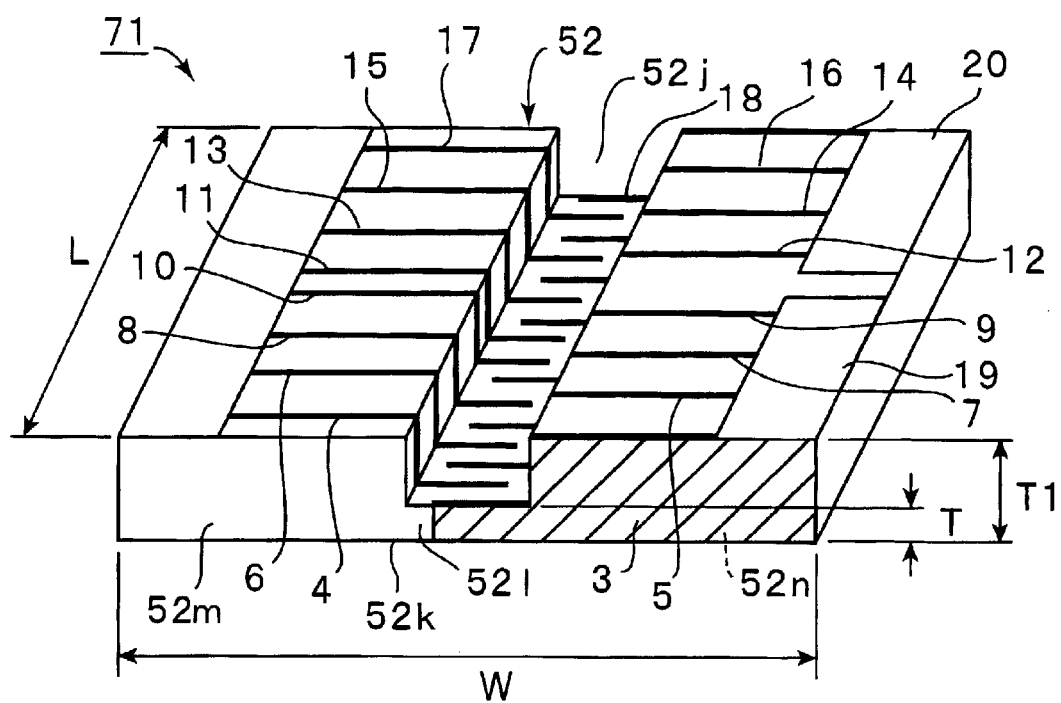
FIG. 10 is a perspective view showing a longitudinally coupled multi-mode piezoelectric bulk wave filter according to a second preferred embodiment of the present invention.

FIG. 10 shows a perspective view to illustrate a longitudinally coupled multi-mode piezoelectric bulk wave filter 71 according to a second preferred embodiment of the present invention. The piezoelectric bulk wave filter 71 includes a piezoelectric substrate 52 that has a groove 52*j* in the middle of a top surface 52*a* of the piezoelectric substrate 52. The laminated piezoelectric portion is defined by a piezoelectric substrate portion between the bottom surface of the groove 52*j* and a bottom surface 52*k* of the piezoelectric substrate 52. Piezoelectric portions 52*m* and 52*n* are disposed on both sides of the laminated piezoelectric portion 52*l*.

The other components are preferably identical to the counterparts of the multi-mode piezoelectric bulk wave filter 51 according to the first preferred embodiment of the present invention.

Therefore, in the multi-mode piezoelectric bulk wave filter 71 as well, even though the thickness T of the laminated piezoelectric body 52*l* is reduced, since the thickness T1 of each of the piezoelectric portions 52*m* and 52*n* can be increased, the mechanical strength of the entirety of the piezoelectric bulk wave filter 71 can be increased.

Figure 11:
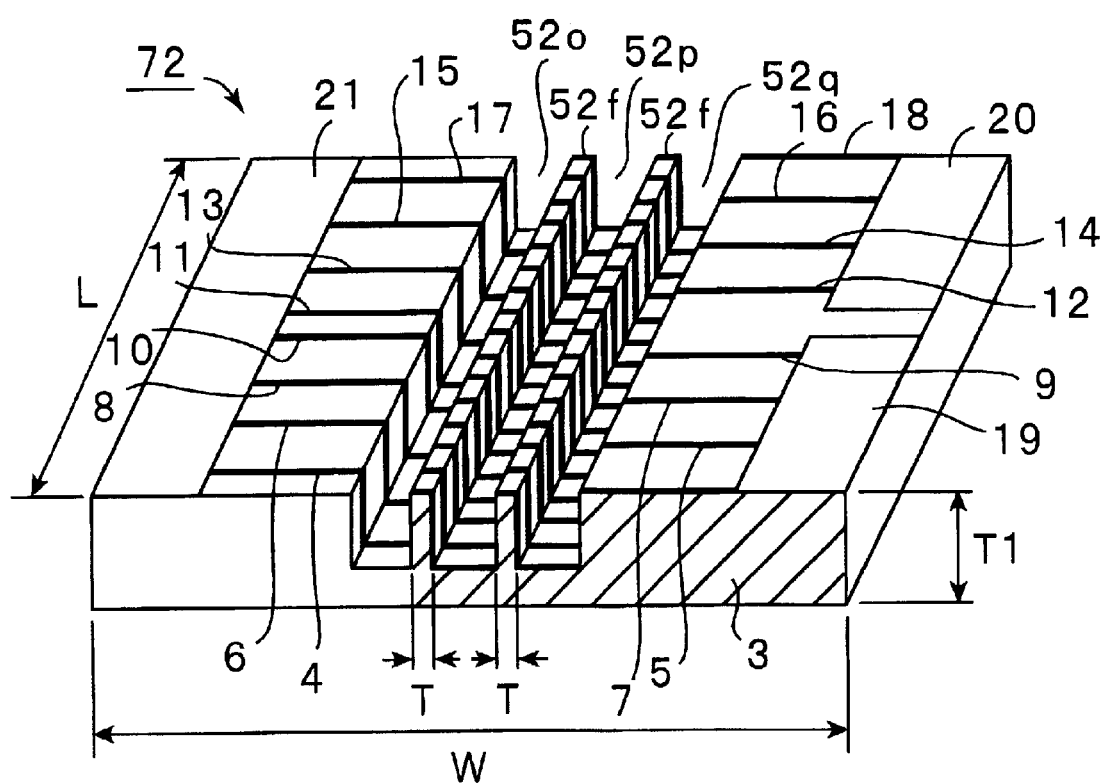
FIG. 11 is a perspective view showing a modified example of the longitudinally coupled multi-mode piezoelectric bulk wave filter according to the first preferred embodiment of the present invention.
Figure 12:
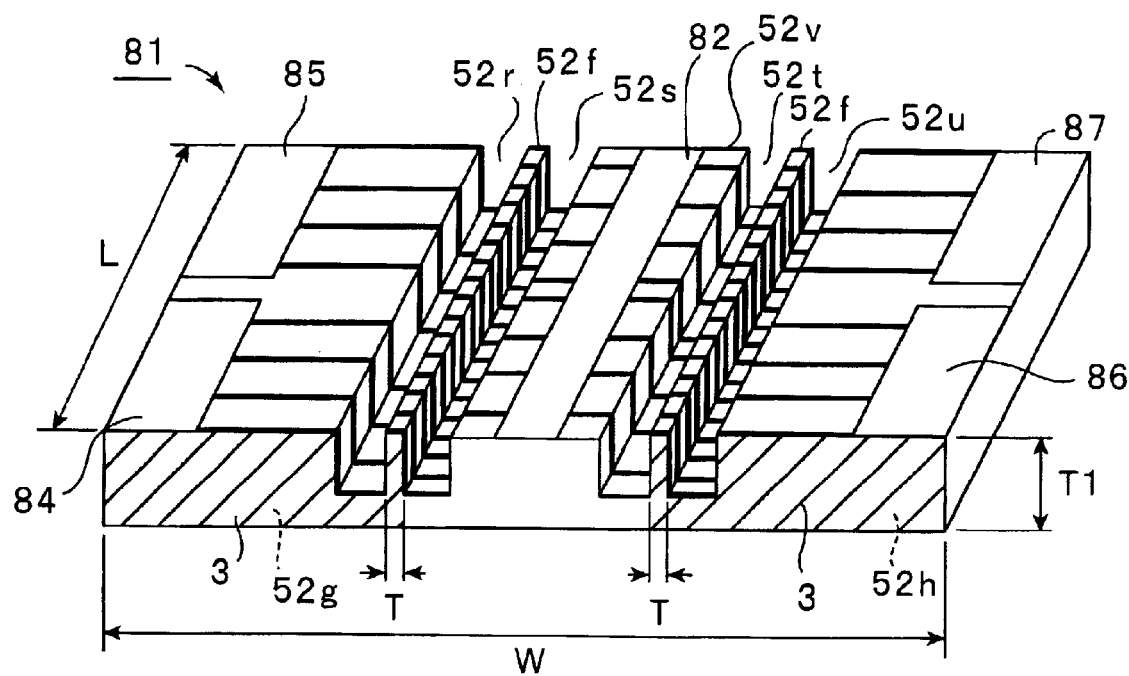
FIG. 12 is a perspective view showing another modified example of the longitudinally coupled multi-mode piezoelectric bulk wave filter according to the first preferred embodiment of the present invention.

FIGS. 11 and 12 show perspective views of variations of the longitudinally coupled multi-mode piezoelectric bulk wave filter 51.

In FIG. 11, a multi-mode piezoelectric bulk wave filter 72 includes the piezoelectric substrate 52 having three grooves 52*o*, 52*p*, and 52*q* that define two laminated piezoelectric bodies 52*f* and 52*f*.

In this manner, at least three grooves may be arranged to produce at least two laminated piezoelectric bodies 52*f* and 52*f* on the piezoelectric substrate 52.

The laminated piezoelectric bodies 52*f* and 52*f* are connected in parallel. Therefore, when the piezoelectric bulk wave filter 72 is compared with the multi-mode piezoelectric bulk wave filter 51 according to the first preferred embodiment, the capacitance between the input and output terminals is doubled and the matching impedance is halved. By thus changing the number of grooves and laminated piezoelectric bodies, the impedance of the piezoelectric bulk wave filter 72 can be easily matched with that of the external circuit.

Furthermore, as shown in FIG. 12, a multi-mode piezoelectric bulk wave filter 81 may include a capacitance electrode 82 to provide repeater capacitance. On the bottom surface of the piezoelectric substrate 52, a capacitance electrode (not shown) connected to the ground potential is arranged so as to face the capacitance electrode 82. In addition, four grooves 52*r*, 52*s*, 52*t*, and 52*u*, and the two laminated piezoelectric bodies 52*f* and 52*f* are disposed on the piezoelectric substrate 52. The capacitance electrode 82 is disposed on the top surface of a piezoelectric portion 52*v* between the grooves 52*s* and 52*t*.

An input electrode 84 and a ground electrode 85 are disposed on a top surface of the piezoelectric portion 52*g*. An output electrode 86 and a ground electrode 87 are disposed on a top surface of the piezoelectric portion 52*h*. That is, the input electrode 84, the output electrode 86, and the ground electrodes 85 and 87 are arranged so that a two-element longitudinally coupled multi-mode piezoelectric bulk wave filter including two laminated piezoelectric bodies 52*f* and 52*f* can be cascaded. In addition, the capacitance electrode 82 defines the repeater capacitance.

Accordingly, in the piezoelectric bulk wave filter 81, use of a single piezoelectric bulk wave filter 81 can realize the attenuation corresponding to the attenuation of two piezoelectric bulk wave filters arranged in cascade.

Figure 13:
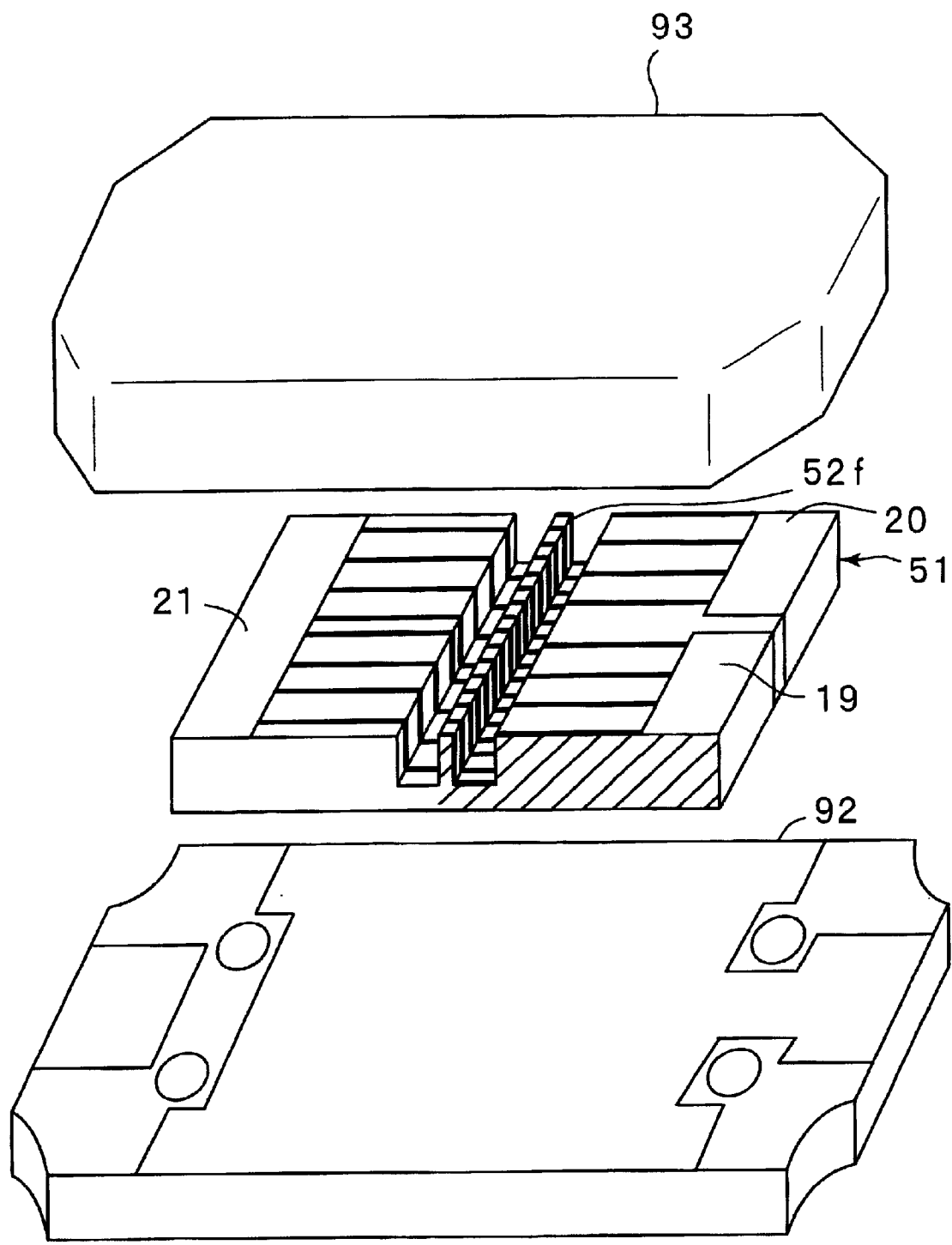
FIG. 13 is an exploded perspective view illustrating an example of an electronic component according to preferred embodiments of the present invention.

FIG. 13 shows an exploded perspective view of one example of an electronic component according to preferred embodiments of the present invention.

In an electronic component 91, the piezoelectric bulk wave filter 51 is implemented on a casing substrate 92 and a cap material 93 is fixed to the casing substrate 92 so as to cover the piezoelectric bulk wave filter 51. The input electrode 19, the output electrode 20, and the ground electrode 21 are arranged so as to cover from a portion of a top surface through a side surface to a bottom surface of the piezoelectric substrate. Thus, the multi-mode piezoelectric bulk wave filter of preferred embodiments of the present invention can be provided as the electronic component included in a package including the casing substrate and the cap material.

In the piezoelectric bulk wave filter 51, even though the bottom surface of the piezoelectric substrate 52 is fixed to the casing substrate 92 to enclose the vibration energy of the laminated piezoelectric body 52*f*, the filter characteristic of the piezoelectric bulk wave filter 51 is not substantially affected.

Figure 14A:
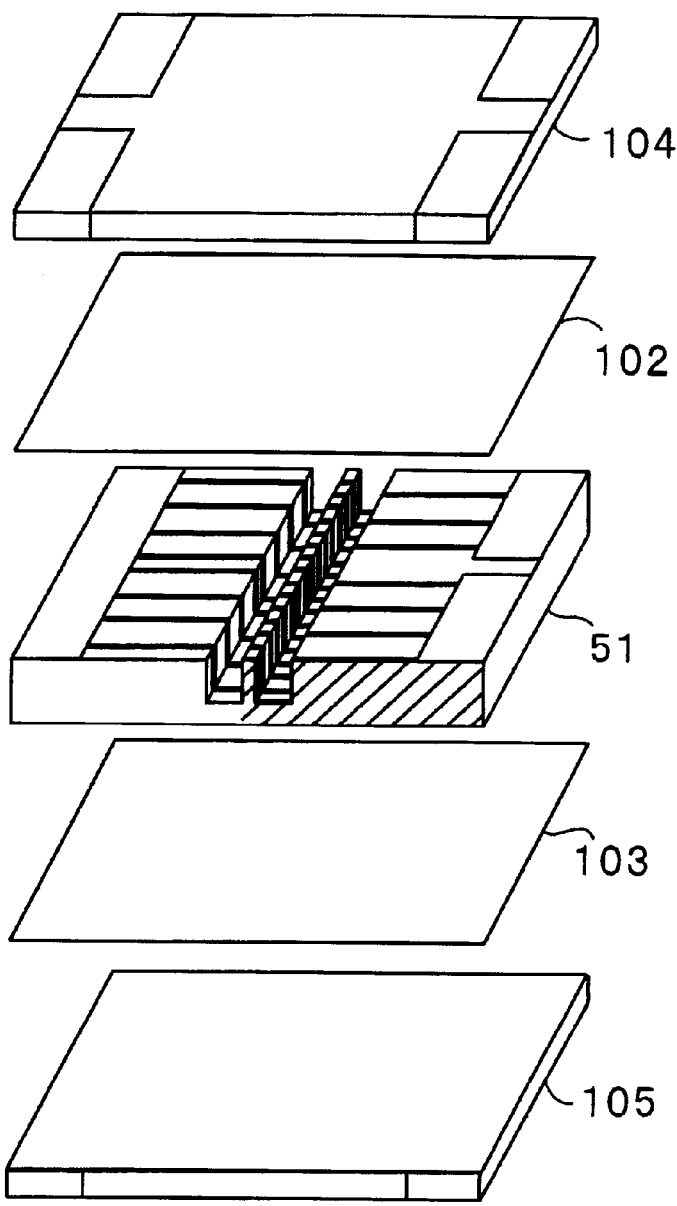
FIGS. 14A and 14B are an exploded perspective view and a front cross-section view, respectively, illustrating another example of the electronic component according to preferred embodiments of the present invention.
Figure 14B:
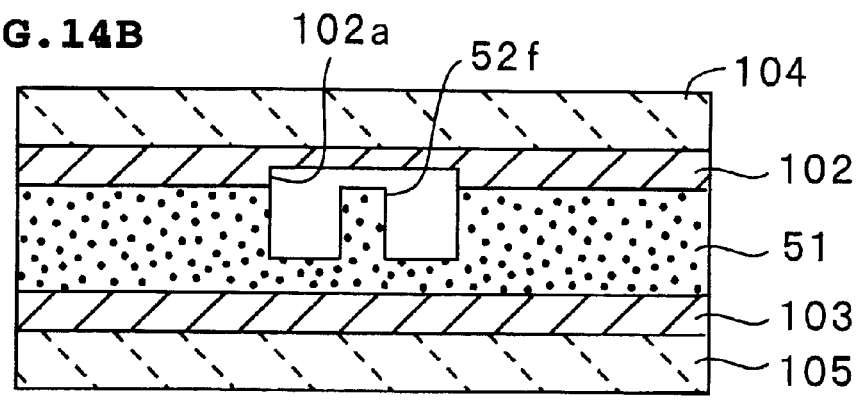
Figure 15:
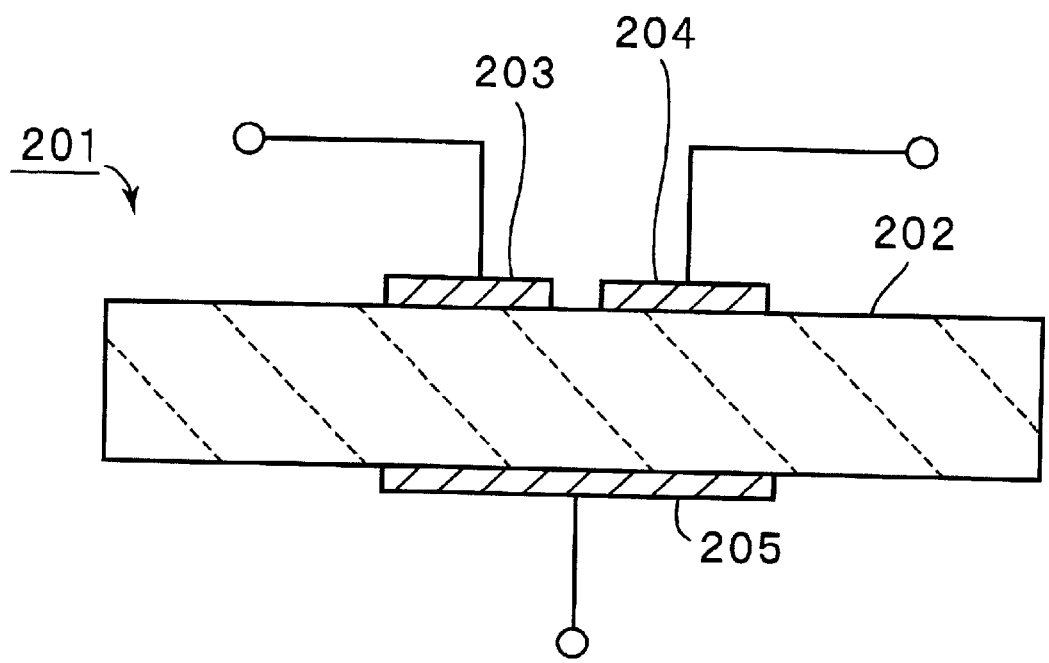
FIG. 15 is a front cross-sectional view showing a known double-mode piezoelectric bulk wave filter.
Figure 16A:
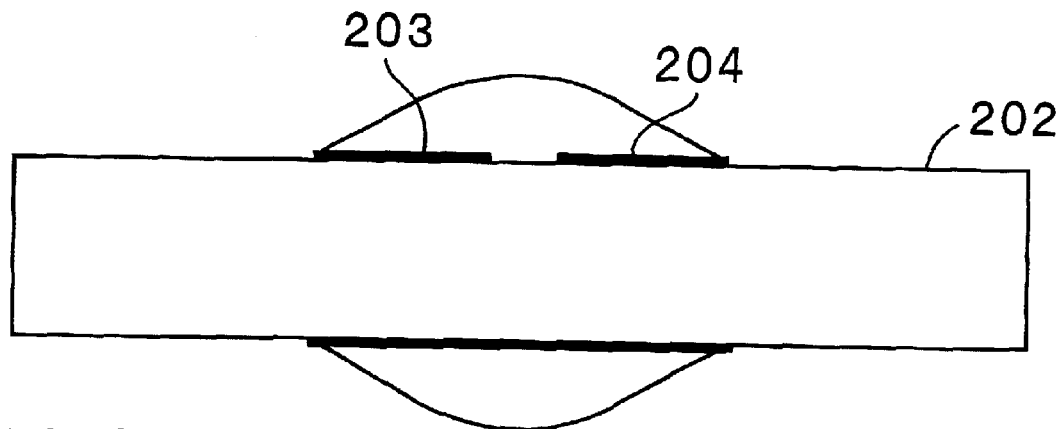
FIGS. 16A and 16B are front views illustrating the symmetric mode and the anti-symmetric mode generated in the known double-mode piezoelectric bulk wave filter.
Figure 16B:
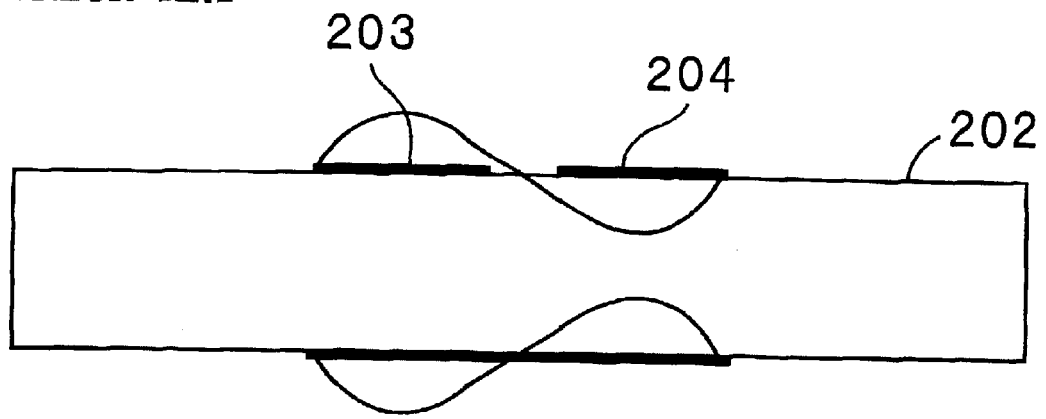

FIGS. 14A and 14B show a perspective exploded view and a front cross-sectional plan view of another example of the electronic component of preferred embodiments of the present invention, respectively. In the electronic component 101, reflecting layers 102 and 103 are laminated on a top surface and a bottom surface of the multi-mode piezoelectric bulk wave filter 51, respectively, and the casing substrates 104 and 105 are laminated on the external surfaces of the reflecting layers 102 and 103, respectively. Thus, the longitudinally coupled multi-mode piezoelectric bulk wave filter of preferred embodiments of the present invention can be provided as a laminated electronic component having excellent mechanical strength.

The acoustic impedance $Z_2$ of each of the reflecting layers 102 and 103 is preferably less than the acoustic impedance $Z_1$ of the piezoelectric bulk wave filter 51 and the acoustic impedance $Z_3$ of each of the casing substrates 104 and 105. Therefore, vibrations propagating from the piezoelectric bulk wave filter 51 to the reflecting layer 102 and 103 are reflected from the interface between the reflecting layer 102 and the casing substrate 104 and the interface between the reflecting layer 103 and the casing substrate 105, respectively. Accordingly, adopting such a laminated structure does not substantially affect the filter characteristic of the piezoelectric bulk wave filter 51.

A concave unit 102a is provided on a bottom surface of the reflecting layer 102 in order to avoid contact with ends of the laminated piezoelectric body 52f. By disposing the concave unit 102a in the bottom surface of the reflecting layer 102 in this manner, the laminated electronic component 101 can be constructed with less influence over the filter characteristic of the laminated piezoelectric body 52f.

It should be understood that the foregoing description is only illustrative of the present invention. Various alternatives and modifications can be devised by those skilled in the art without departing from the present invention. Accordingly, the present invention is intended to embrace all such alternatives, modifications and variances which fall within the scope of the appended claims.

What is claimed is:

1. A longitudinally coupled multi-mode piezoelectric bulk wave filter, using a piezoelectric longitudinal effect, comprising:
   at least one laminated piezoelectric element including:
      at least four excitation electrodes disposed substantially parallel to and spaced from one another at a distance D; and
      a plurality of piezoelectric layers, each disposed between two adjacent electrodes of said at least four excitation electrodes, the plurality of piezoelectric layers being polarized in a direction that is substantially perpendicular or parallel to said at least four excitation electrodes, wherein a cross section of said at least one laminated piezoelectric element in the direction that is substantially perpendicular to a lamination direction of said at least one laminated piezoelectric element is substantially rectangular and has a thickness T;
   a piezoelectric portion having a thickness that is greater than the thickness dimension T and being aligned with said at least one laminated piezoelectric element;
   an input electrode;
   an output electrode;
   a ground electrode;
   said at least four excitation electrodes including:
      a first group of excitation electrodes electrically connected to the input electrode;
      a second group of excitation electrodes electrically connected to the output electrode; and
      a third group of excitation electrodes electrically connected to the ground electrode, the first group and the third group being alternately disposed in the lamination direction, and the second group and the third group being alternately disposed in the lamination direction; wherein when an input signal is applied between the input electrode and the ground electrode, mode vibrations having different orders are generated and combined into an output signal between the output electrode and the ground electrode, and the ratio of the thickness T to the distance D is equal to or less than about 0.9.

2. A longitudinally coupled multi-mode piezoelectric bulk wave filter according to claim 1, wherein the input electrode, the output electrode, and the ground electrode are disposed on the piezoelectric portion.

3. A longitudinally coupled multi-mode piezoelectric bulk wave filter according to claim 1, further comprising a piezoelectric substrate for providing said at least one laminated piezoelectric element and piezoelectric portion thereon, wherein:
   a plurality of grooves are disposed on one side of the piezoelectric substrate;
   a piezoelectric substrate portion located between two adjacent grooves defines the laminated piezoelectric element; and
   a remaining piezoelectric substrate portion defines the piezoelectric portion.

4. A longitudinally coupled multi-mode piezoelectric bulk wave filter according to claim 1, wherein a groove is disposed on one surface of a piezoelectric substrate for providing said at least one laminated piezoelectric element and the piezoelectric portion thereon;
   a portion between the bottom of the groove and the other principal surface of the piezoelectric substrate defines the laminated piezoelectric element; and
   a piezoelectric substrate portion on both sides of the groove defines the piezoelectric portion.

5. A longitudinally coupled multi-mode piezoelectric bulk wave filter according to claim 3, wherein a plurality of laminated piezoelectric elements are provided on the piezoelectric substrate.

6. A longitudinally coupled multi-mode piezoelectric bulk wave filter according to claim 1, wherein the mode vibrations having different orders are harmonics waves in the longitudinal vibration mode using the piezoelectric longitudinal effect.

7. A longitudinally coupled multi-mode piezoelectric bulk wave filter according to claim 1, wherein the mode vibrations having different orders are harmonics waves in the thickness longitudinal vibration mode using the piezoelectric longitudinal effect.

8. An electronic component comprising:
   a casing substrate;
   a longitudinally coupled multi-mode piezoelectric bulk wave filter according to claim 1 mounted on the casing substrate; and
   a cap material fixed to the casing substrate so as to cover the longitudinally coupled multi-mode piezoelectric bulk wave filter.

9. An electronic component according to claim 8, wherein the input electrode, the output electrode, and the ground electrode are disposed on the piezoelectric portion.

10. An electronic component according to claim 8, further comprising a piezoelectric substrate for providing said at least one laminated piezoelectric element and piezoelectric portion thereon, wherein:
   a plurality of grooves are disposed on one side of the piezoelectric substrate;
   a piezoelectric substrate portion located between two adjacent grooves defines the laminated piezoelectric element; and a remaining piezoelectric substrate portion defines the piezoelectric portion.

11. An electronic component according to claim 8, wherein a groove is disposed on one surface of a piezoelectric substrate for providing said at least one laminated piezoelectric element and the piezoelectric portion thereon;
- a portion between the bottom of the groove and the other principal surface of the piezoelectric substrate defines the laminated piezoelectric element; and
- a piezoelectric substrate portion on both sides of the groove defines the piezoelectric portion.

12. An electronic component according to claim 10, wherein a plurality of laminated piezoelectric elements are provided on the piezoelectric substrate.

13. An electronic component according to claim 8, wherein the mode vibrations having different orders are harmonics waves in the longitudinal vibration mode using the piezoelectric longitudinal effect.

14. An electronic component according to claim 8, wherein the mode vibrations having different orders are harmonics waves in the thickness longitudinal vibration mode using the piezoelectric longitudinal effect.

15. An electronic component comprising:
- a casing substrate;
- a reflecting layer disposed on the casing substrate; and
- a longitudinally coupled multi-mode piezoelectric bulk wave filter according to claim 1 fixed to the casing substrate via the reflecting layer, wherein an acoustic impedance $Z_2$ of the reflecting layer is less than an acoustic impedance $Z_1$ of a material of a laminated piezoelectric portion of the longitudinally coupled multi-mode piezoelectric bulk wave filter and less than the acoustic impedance $Z_3$ of the casing substrate.

16. An electronic component according to claim 15, wherein the input electrode, the output electrode, and the ground electrode are disposed on the piezoelectric portion.

17. An electronic component according to claim 15, further comprising a piezoelectric substrate for providing said at least one laminated piezoelectric element and piezoelectric portion thereon, wherein:
- a plurality of grooves are disposed on one side of the piezoelectric substrate;
- a piezoelectric substrate portion located between two adjacent grooves defines the laminated piezoelectric element; and
- a remaining piezoelectric substrate portion defines the piezoelectric portion.

18. An electronic component according to claim 15, wherein a groove is disposed on one surface of a piezoelectric substrate for providing said at least one laminated piezoelectric element and the piezoelectric portion thereon;
- a portion between the bottom of the groove and the other principal surface of the piezoelectric substrate defines the laminated piezoelectric element; and
- a piezoelectric substrate portion on both sides of the groove defines the piezoelectric portion.

19. An electronic component according to claim 17, wherein a plurality of laminated piezoelectric elements are provided on the piezoelectric substrate.

20. An electronic component according to claim 15, wherein the mode vibrations having different orders are harmonics waves in the longitudinal vibration mode using the piezoelectric longitudinal effect.

21. An electronic component according to claim 15, wherein the mode vibrations having different orders are harmonics waves in the thickness longitudinal vibration mode using the piezoelectric longitudinal effect.

* * * * *